United States Patent [19]
Kleinberg

[11] Patent Number: 4,873,498
[45] Date of Patent: Oct. 10, 1989

[54] REFLECTION OSCILLATORS EMPLOYING SERIES RESONANT CRYSTALS'

[75] Inventor: Leonard L. Kleinberg, Annapolis, Md.

[73] Assignee: The United States of America as represented by the Administrator, National Aeronautics and Space Administration, Washington, D.C.

[21] Appl. No.: 292,037

[22] Filed: Dec. 30, 1988

[51] Int. Cl.[4] .............................................. H03B 5/12
[52] U.S. Cl. ......................... 331/116 FE; 331/117 FE
[58] Field of Search ........ 331/116 R, 116 FE, 117 R, 331/117 FE

[56] References Cited
U.S. PATENT DOCUMENTS
4,553,110 11/1985 Kleinberg ..................... 331/116 FE Primary Examiner—Eugene R. LaRoche
Assistant Examiner—Robert J. Pascal
Attorney, Agent, or Firm—R. Dennis Marchant; John R. Manning; Ronald F. Sandler

[57] ABSTRACT

A reflection oscillator is provided which employs an active device operated in its roll-off region and two resonant circuits. For an oscillator employing a bipolar transistor, the emitter is connected to a series resonant capacitor-crystal network and the base is connected to an L-C tank circuit with the transistor being operated in the roll-off region of its gain versus frequency curve. This will provide a very high frequency of operation with a relatively inexpensive, low frequency, active device. These oscillators are easily tuned, stable, and require little d.c. power.

8 Claims, 2 Drawing Sheets

REFLECTION OSCILLATORS EMPLOYING SERIES RESONANT CRYSTALS

ORIGIN OF THE INVENTION

The invention described herein was made by an employee of the United State Government, and may be manufactured and used by or for the Government for governmental purposes without the payment of any royalties thereon or therefor.

TECHNICAL FIELD

This invention relates to oscillators, and, more particularly, to reflection oscillators.

BACKGROUND ART

Reflection oscillators have been employed since the introduction of solid state devices into the realm of circuit design. Devices such as impatts, trapatts, and tunnel diodes are two terminal devices that reflect a negative conductance across their terminals, and, when connected across a low loss resonant circuit, will sustain oscillations. Bipolar and field effect transistors obtain a negative conductance by inserting a reactance at one terminal and, through the transistor's gyrator characteristic, reflect a negative conductance at another terminal. The third terminal is employed as an output terminal. The negative conductance may sustain oscillations when connected across a low loss resonant circuit. Such oscillators are usually employed in the microwave region and are not crystal controlled. Currently, however, a fundamental or overtone crystal is commonly employed in a grounded base configuration of a Colpitts oscillator. For a given frequency, the transistor is operated in the flat portion of its gain versus frequency curve, which is considerably lower than $F_t$. This necessitates a relatively high frequency device, which is usually more costly. Alternatively, the F for such devices may be only increased by increasing the quiesient current.

Beyond 1 GHz, SAW resonators may extend the frequency range beyond the range of currently available crystals to 1.5 GHz. Beyond this frequency range, dielectric resonators (DRs) are now being employed up to 15 GHz. However, 15 GHz or 1.5 GHz SAW and DR oscillators have not achieved the stability of crystal oscillators. To achieve higher frequencies with crystal controlled oscillators, the current practice is to employ multipliers.

STATEMENT OF THE INVENTION

Accordingly, it is an object of this invention to provide a high frequency, stable oscillator.

It is another object of the invention to provide a high frequency, low power, low current oscillator.

It is yet another object of the invention to provide an inexpensive, high frequency oscillator.

It is still another of the invention to provide an easily tuned, high frequency oscillator.

Briefly, these and other objects are achieved in a crystal-controlled oscillator which includes a transistor operated in its roll-off region and a crystal operating as a series resonant component in series with a capacitor.

DETAILED DESCRIPTION OF THE INVENTION

Crystals have recently become available which are cut to operate at fundamental frequencies up to about 500 MHz and overtone frequencies up to about 1 GHz. The instant invention takes advantage of these high frequency crystals by providing reflection oscillators which include active devices operated well into their roll-off characteristic. In the case of a bipolar transistor, the transistor is operated well beyond its 3 db down point on its current gain versus frequency curve. For field effect transistors, the transistor is operated well beyond its 3 db down point on its transconductance versus frequency curve.

These circuits employ a crystal operating as a series resonant component in series with a capacitor. For the bipolar transistor circuit, the series capacitor-crystal network is in the emitter while for a field effect transistor, the series capacitor-crystal network is in the source. The crystal, in the bipolar transistor configuration, provides, ideally, a series resistance in series with a capacitor in the emitter circuit which modifies the negative conductance reflected across the base by the series capacitance so that, at the resonant frequency, the maximum negative conductive is reflected. These circuits provide relatively low power designs using relatively low cost active components. The circuits are additionally cost effective in terms of employing a minimum number of parts with attendant low labor costs for construction and testing.

Figure 1:
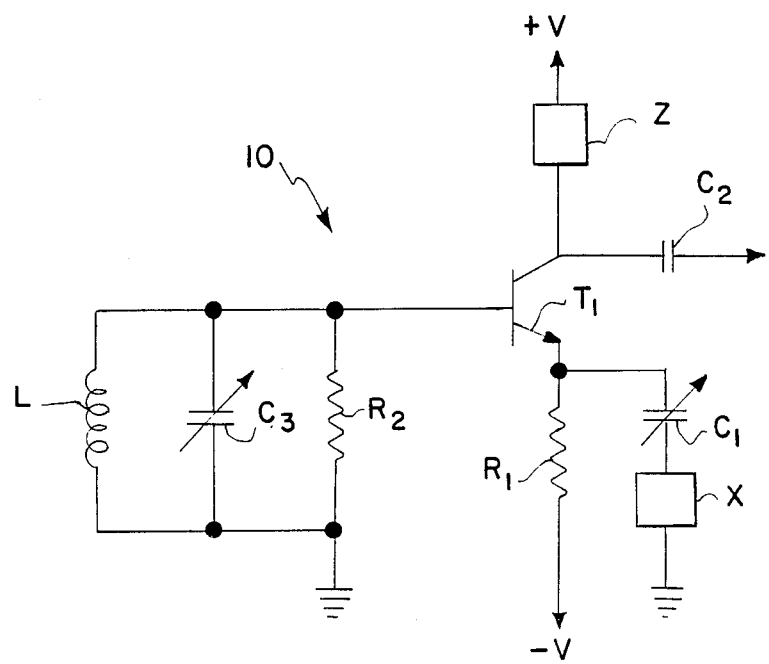
FIG. 1 is a schematic representation of an oscillator, employing a bipolar transistor, in accordance with this invention.

Referring now to the drawings wherein like references numerals and characters designate identical or corresponding parts throughout the figures, and more particularly to FIG. 1 wherein a reflection oscillator 10 is illustrated. This oscillator is shown as including a single bipolar transistor $T_1$ as its sole active element. A 2N930 transistor was chosen for this embodiment because it has a comparatively high frequency characteristic and it is relatively inexpensive. The emitter of transistor $T_1$ is connected to a variable capacitor $C_1$, which may be in the range of 3 to 15 pf, in series with a 25 MHz third overtone crystal X which is connected to ground. The emitter is also connected to resistor $R_1$, which may be 4.3 KΩ, which is in parallel with the capacitor $C_1$—crystal series network and is connected to $-V$, which may be a $-5$ volt power supply. The collector of transistor $T_1$ is connected to an impedance Z which is, in turn, connected to $+V$, which may be a $+5$ volt power supply. Impedance Z may be any relatively small impedance, such as a 220Ω resistor, from which an output signal may be extracted. It may also be a parallel L-C network which will not have any significant resistive loss and will aid in signal filtering. It may also be a more detailed matching network, such as an "L" section. An a.c. coupling capacitor, $C_2$, which may be in the order of 0.01 μf, may be connected to the transistor collector. The base of transistor $T_1$ is connected to a parallel network comprised of L, $C_3$, and $R_2$, which may be a 1 μh inductor, an adjustable capacitor set to about 20 pf and a 20 KΩ resistor, respectively. $R_2$ is employed to set the negative conductance equal to a positive conductance at the frequency of interest. In the circuit configuration of FIG. 1, therefore, the base sees a d.c. ground and the emitter will be about −0.7 volts due to the forward biased, base to emitter, diode voltage drop. Accordingly, the circuit will be biased by the voltage across $R_1$, i.e., about 4.3 volts across the 4.3K resistance. Accordingly, the emitter will be about center biased and the collector and emitter will draw about 1 ma.

Figure 2:
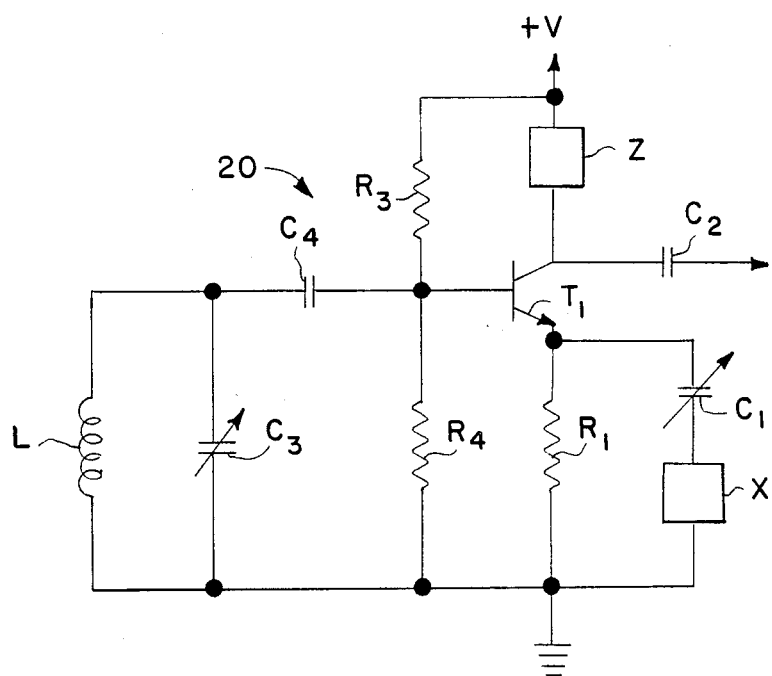
FIG. 2 is a schematic representation of another oscillator employing a bipolar transistor, in accordance with this invention.

FIG. 2 depicts reflection oscillator 20 which is an equivalent of oscillator 10. The components are the same except that a $R_2$ is eliminated and, $R_3$, $R_4$ and $C_4$ are added in order that a single power supply, +V, may be employed. $R_3$, $R_4$, $C_4$ and +V may be 39KΩ, 39KΩ, 0.001 μfd and +10 volts, respectively. $R_3$ and $R_4$ set the d.c. bias while $C_4$ provides a d.c. block which is not necessary in the FIG. circuit because the base is operated at ground potential.

Because $R_3$ and $R_4$ have the same magnitude of resistance, they will approximately center bias the emitter between +V and ground. Their equivalent shunt impedance, as seen from the base, will approximate the 20KΩ resistance of $R_2$ in FIG. 1. Accordingly, the functional equivalency of the circuits of FIG. 1 and FIG. 2 should be apparent.

FIG. 1 and FIG. 2 also operate similarly. Crystal X sets the oscillator frequency. If Z is a tuned circuit, Z is tuned to the crystal frequency. The $C_1$, X network is reflected to the base and appears, in essence, as a capacitance, resistance and a negative resistance, all of which are in parallel with the L, $C_3$ and $R_2$ (or the $R_3$, $R_4$ equivalent). The negative resistance is an essential requirement for oscillation to occur. The L, $C_3$ tuned circuit must be tuned somewhat higher than the crystal frequency because of the reflected capacitance, i.e., the L, $C_3$ circuit must be somewhat inductive for the reflected capacitance to tune this tuned circuit to the crystal frequency.

Figure 3:
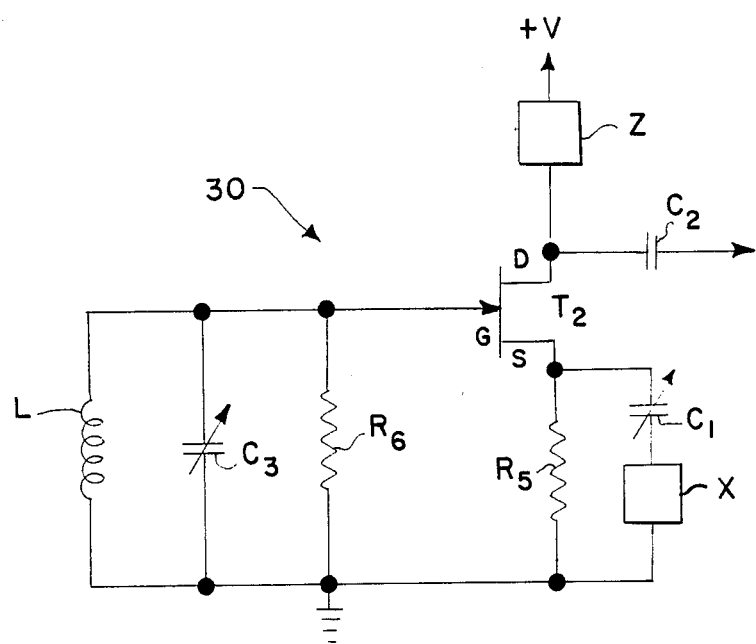
FIG. 3 is a schematic representation of another oscillator, employing a field effect transistor, in accordance with this invention.

FIG. 3 depicts a reflection oscillator circuit 30, employing a field effect transistor (FET) $T_2$, which circuit is, in essence, a functional equivalent of circuits 10 and 20. Field effect transistor $T_2$ may be an N - or P- channel type, the requirement only being that it have a high transconductance, $g_m$. Its drain D is connected to impedance Z, which may be either resistive or tuned, as in the previously described circuits and which is also connected to a.c. coupling capacitor $C_2$. Impedance Z is, in turn, connected to a power supply, +V, which may be about +10 volts. The source connection of transistor $T_2$ is connected to ground through resistor $R_5$, which may be about 2.2KΩ, and is also connected to ground through a series variable $C_1$, crystal network in parallel with resistor $R_5$. The gate connection is connected to ground both through resistor $R_6$ as well as through inductor L, both of which provide a d.c. path for the gate. The magnitude of $R_6$ is related not to the biassing but to the reflected -R and the conditions for oscillation. The FET is essentially self-biased in a linear region. Resistor in conjunction with $R_6$, sets the transconductance of the FET. For this circuit to operate, $g_m^{-1}$ must be small compared to the reactance of $C_1$. It should be noted that inductor L may be one winding of a transformer with the other winding connected to the load. This is also true for circuits 10 and 20.

It should be emphasized that the transistors employed in circuits 10, 20 and 30 are operated at about one-half the transistor frequency $F_t$, which is considerably higher than the 3 db frequency of the device operated, for instance, in the case of the bipolar transistor, in the grounded emitter configuration. The operation of these circuits can be analyzed as follows. For the bipolar transistor circuits, the input admittance at the base of transistor $T_1$ due to the series combination of crystal X and capacitor $C_1$ is given by:

$$Y_{in} = \frac{(1 + J\omega_t/\omega)}{1 + (\omega_t/\omega)^2} \times \frac{1}{(R + 1/J\omega C)} \quad (1)$$

where $R_x$ is the series resistance of the crystal at resonance and $\Omega_t$ is the transitional radian frequency of $T_1$.

Performing an algebraic manipulation on equation (1) we obtain:

$$Y_{in} = \frac{(\omega^2 C_1^2 R_x - \omega_t C_1) + J\omega C_1 (1 + \omega_t C_1 R_x)}{[1 + (\omega_t^2/\omega)] \times (1 + \omega^2 C_1^2 R_x^2)} \quad (2)$$

Equation (2) has excluded the effects of resistor $R_1$ as it is significantly larger in magnitude than the $C_1$, X series network. Also, the emitter impedance is discounted as it is small in comparison with said series network.

A coarse approximation of equation (2) is:

$$Y_{in} = -\omega^2 C_1/\omega_t + \omega^2/\omega_t^2 X \, J\omega C_1(1+\omega_t C_1 R_x) \quad (3)$$

Thus, the $C_1$, X network in the emitter of transistor $T_1$ reflects as a negative conductance in parallel with a capacitive susceptance, as given by equation (3).

Figure 4:
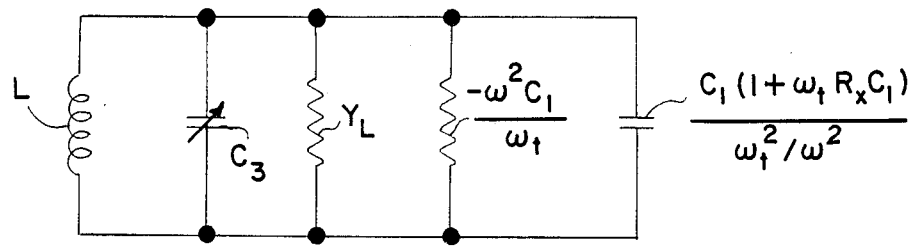
FIG. 4 is an equivalent circuit which may represent this invention under certain conditions.

FIG. 4 depicts an equivalent circuit that is useful in analyzing the conditions of oscillation. The conditions of oscillation are given by the following equations 4 and 5 employing the parameters set forth in FIG. 4, which equations represent the separation of equation 3 into its real and imaginary parts:

$$1/J\omega L + J\omega C_3 + J\omega C_1 (1+\omega_t R_x C_1)\omega^2/\omega_t^2 = O \quad (4)$$

$$Y_L - \omega^2 C_1/\omega_t = O, \quad (5)$$

where $Y_L$ represents the admittance related to the total losses in the base circuit of $T_1$, which includes both the coil losses as well as the losses due to $R_2$.

An approximate solution of equation (4) is:

$$\omega^2 = 1/L(C_3 + C_1/4) \quad (6)$$

This is useful in determining the approximate frequency of operation and the major elements which determine that frequency. The analysis for FETs is similar; only the parameters and values are different.

What has been described is an invention which includes reflection oscillator circuits which can operate as high frequencies while employing relatively low frequency, inexpensive active components which do not require high gain-bandwidths or high current operation. These circuits require little d.c. power and are suitable for use in integrated circuits. The crystals provide the negative resistance required for oscillation over a very easily tuned, narrow and selective range, as well as frequency stability.

I claim:

1. A reflection oscillator including an active device with at least two terminals operated in its roll-off region and further including two tuned circuits, one of which is connected to one terminal of said device and the other of which is connected to another terminal of said device.

2. The reflection oscillator of claim 1 wherein said one tuned circuit includes a series resonant crystal.

3. The reflection oscillator of claim 1 wherein said other tuned circuit includes a lumped constant L-C resonant circuit.

4. The reflection oscillator of claim 2 wherein said crystal is the fundamental frequency setting element of said oscillator.

5. A reflection oscillator including a bipolar transistor operated on the roll-off region of its gain versus frequency curve and further including two tuned circuits, one of which is a series resonant, capacitance, crystal network connected to said transistor's emitter and the other is a lumped constant, L-C resonant circuit connected to said transistor's base.

6. The reflection oscillator of claim 5 wherein an impedance is connected to said transistor's collector and the output of said oscillator is taken from said collector.

7. A reflection oscillator including a field effect transistor operated on the roll-off region of its transconductance versus frequency curve and further including two tuned circuits, one of which is a series resonant, capacitance, crystal network connected to said transistor's source and the other is a lumped constant, L-C resonant circuit connected to said transistor's gate.

8. The reflection oscillator of claim 7 wherein an impedance is connected to said transistor's drain and the output of said oscillator is taken from said drain.

* * * * *